(12) United States Patent
Li et al.

(10) Patent No.: US 12,467,793 B2
(45) Date of Patent: Nov. 11, 2025

(54) ANALOG-TO-DIGITAL CONVERTER AND THERMOPILE ARRAY (71) Applicant: CSMC TECHNOLOGIES FAB2 CO., LTD., Wuxi (CN)

(72) Inventors: Chen Li, Wuxi (CN); Hao Wang, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 601 days.

(21) Appl. No.: 17/796,952

(22) PCT Filed: May 27, 2021

(86) PCT No.: PCT/CN2021/096381
§ 371 (c)(1),
(2) Date: Aug. 2, 2022

(87) PCT Pub. No.: WO2022/062448
PCT Pub. Date: Mar. 31, 2022

(65) Prior Publication Data
US 2023/0067583 A1 Mar. 2, 2023

(30) Foreign Application Priority Data
Sep. 22, 2020 (CN) .......................... 202011000336.X (51) Int. Cl.
*G01J 5/12* (2006.01)
*G01J 5/20* (2006.01)
(52) U.S. Cl.
CPC ........... *G01J 5/12* (2013.01); *G01J 2005/202* (2013.01)

(58) Field of Classification Search
CPC .............................. G01J 5/12; G01J 2005/202
See application file for complete search history.

(56) References Cited

U.S. PATENT DOCUMENTS

| 6,288,664 B1 * | 9/2001 | Swanson | ............... | H03M 1/208 |
| | | | | 341/139 |
| 6,462,612 B1 * | 10/2002 | Roh | .......... | G05F 3/30 |
| | | | | 327/539 |

(Continued)

FOREIGN PATENT DOCUMENTS

| CA | 2326019 A1 * | 5/2001 | ............ H03M 3/356 |
| CN | 1317880 | 10/2001 | |

(Continued)

OTHER PUBLICATIONS

U.S. Appl. No. 17/796,952, filed Feb. 6, 2025_CA_2326019_A1_H.pdf,May 19, 2001.*

(Continued)

*Primary Examiner* — Julian D Huffman
(74) *Attorney, Agent, or Firm* — Dority & Manning, PA (57) ABSTRACT

An analog-to-digital converter and a thermopile array. The analog-to-digital converter comprises: a reference voltage generation circuit comprising a voltage generation unit; a chopping modulation unit used to perform chopping modulation on a voltage signal generated by the voltage generation unit, and to modulate low frequency noise of the voltage signal into high frequency noise; and a low-pass filter used to eliminate the high frequency noise to obtain a reference voltage. The invention employs a simple structure to obtain a low noise reference voltage at low costs.

13 Claims, 4 Drawing Sheets (56) References Cited

U.S. PATENT DOCUMENTS

| | | | | |
|---|---|---|---|---|
| 7,538,705 | B2* | 5/2009 | Deval | H03M 3/34 |
| | | | | 341/120 |
| 9,602,120 | B1* | 3/2017 | Plouchart | H03M 1/0809 |
| 9,800,262 | B1* | 10/2017 | Maurino | H03M 1/08 |
| 11,121,718 | B1* | 9/2021 | Maurino | H03M 1/0626 |
| 2008/0024342 | A1 | 1/2008 | Deval et al. | |
| 2011/0043184 | A1 | 2/2011 | Zhu | |
| 2021/0351784 | A1* | 11/2021 | Ren | H03M 3/498 |
| 2023/0421171 | A1* | 12/2023 | Ren | H03M 3/464 |
| 2024/0250693 | A1* | 7/2024 | Gheorghe | H03M 3/464 |

FOREIGN PATENT DOCUMENTS

| | | | | |
|---|---|---|---|---|
| CN | 101263657 | A | | 9/2008 |
| CN | 101657775 | A | | 2/2010 |
| CN | 102176188 | | | 9/2011 |
| CN | 202075655 | U | | 12/2011 |
| CN | 104518797 | | | 4/2015 |
| CN | 104901700 | | | 9/2015 |
| CN | 105353817 | | | 2/2016 |
| CN | 106444949 | A | | 2/2017 |
| CN | 105659056 | B | * | 2/2018 ............ G01D 18/00 |
| CN | 108351252 | A | | 7/2018 |
| CN | 109471486 | | | 3/2019 |
| CN | 109643996 | A | * | 4/2019 ........... G06F 3/0416 |
| CN | 110199181 | | | 9/2019 |
| DE | 102010003125 | | | 9/2011 |
| EP | 2355358 | A1 | * | 8/2011 ............ G01K 1/024 |
| EP | 3661060 | A1 | * | 6/2020 ............... G01K 7/34 |
| EP | 3955467 | A1 | * | 2/2022 .......... H03M 1/0626 |
| JP | 2005521185 | A | * | 7/2005 |
| JP | 2012068265 | A | | 4/2012 |

OTHER PUBLICATIONS

U.S. Appl. No. 17/796,952, Feb. 6, 2025_CN_105659056_B_H. pdf,Feb. 6, 2018.*
U.S. Appl. No. 17/796,952, filed Feb. 6, 2025_CN_109643996_A_ H.pdf,Apr. 16, 2019.*
U.S. Appl. No. 17/796,952, Feb. 6, 2025_EP_2355358_A1_H. pdf,Aug. 10, 2011.*
U.S. Appl. No. 17/796,952, filed Feb. 7, 2025_EP_3661060_A1_ H.pdf,Jun. 3, 2020.*
U.S. Appl. No. 17/796,952, filed Feb. 7, 2025_JP_2005521185_A_ H.pdf,Jul. 14, 2005.*
U.S. Appl. No. 17/796,952, Feb. 6, 2025_EP_3955467_A1_H. pdf,Feb. 16, 2022.*
Chinese Office Action for corresponding Application No. 202011000336X, dated Jun. 1, 2023, 7 pages.
PCT International Search Report and Written Opinion (with English translation) for corresponding PCT Application No. PCT/CN2021/ 096381, mailed Aug. 30, 2021, 15 pages.
Cong, "Integrated Switched-Capacitor Filter and Their Application— Sine Wave Generators", (w/ English translation of Abstract), Practical Electronics Digest, No. 9, Sep. 30, 1995, 3 pages.

* cited by examiner

ANALOG-TO-DIGITAL CONVERTER AND THERMOPILE ARRAY

CROSS-REFERENCES TO RELATED APPLICATIONS

This application is a national phase application of International Patent Application No. PCT/CN2021/096381, filed May 27, 2021, which, in turn, claims priority to Chinese Patent Application No. 202011000336X, entitled "ANALOG-TO-DIGITAL CONVERTER AND THERMOPILE ARRAY" and filed with the Chinese Patent Office on Sep. 22, 2020, the entire contents of both of which are incorporated herein by reference.

TECHNICAL FIELD

The present disclosure relates to analog-to-digital conversion, and in particular, to an analog-to-digital converter (ADC) and a thermopile array.

BACKGROUND

The statements herein merely provide background information related to the present application and do not necessarily constitute a prior art.

Far-infrared thermal sensors are used in a growing number of fields from industrial controls to consumer electronics and then to smart buildings and Internet of Things. With the booming development of consumer markets, the number and integration of the far-infrared thermal sensors have higher requirements, and further improvements in dimensions and costs of the sensors are required. A thermopile sensor is formed by a large number of thermocouples generally coupled in series (or occasionally coupled in parallel). An output voltage of a series thermocouple depends on a temperature difference between a thermocouple junction and a reference junction. The principle is called a seebeck effect. With the upgrading of technologies and markets, thermopile infrared sensors are gradually developing from an early single-pixel structure to an array sensor.

Since thermopile signals are extremely weak, extremely high requirements are put forward for noise floor of the ADC, and noise characteristics of a reference source are very important for the performance of high-precision ADCs.

SUMMARY

In view of the above, there is a need to provide an ADC and a thermopile array having a reference voltage with low noise.

An ADC applied to a thermopile array is provided. The ADC includes a reference voltage generation circuit including: a voltage generation unit; a chopping modulation unit configured to perform chopping modulation on a voltage signal generated by the voltage generation unit, and modulate low-frequency noise of the voltage signal into high-frequency noise; and a low-pass filter configured to eliminate the high-frequency noise to obtain a reference voltage.

A thermopile array is also provided, including: a plurality of sensor pixel cells; and a readout integrated circuit (ROIC) including multiple signal processing channels, each of the signal processing channels including: a pre-amplifier configured to amplify a sensor signal, the pre-amplifier being a single-stage amplifier; and an ADC having an input terminal coupled to an output terminal of the pre-amplifier, the ADC being the ADC according to any one of the foregoing embodiments and being a delta-sigma ADC. Each of the signal processing channels is configured to process the sensor signals output by i sensor pixel cells, where i is a positive integer, and when the number of the plurality of sensor pixel cells is no less than 256, i is no greater than the number of the sensor pixel cells of the thermopile array divided by 4 after extraction of root.

Details of one or more embodiments of the present application are set forth in the following accompanying drawings and descriptions. Other features, objectives, and advantages of the present application become obvious with reference to the specification, the accompanying drawings, and the claims.

BRIEF DESCRIPTION OF THE DRAWINGS

In order to better describe and illustrate embodiments and/or examples of the disclosure, reference may be made to one or more accompanying drawings. Additional details or examples used to describe the accompanying drawings should not be considered as limitations on the scope of any of the disclosed inventions, the presently described embodiments and/or examples, and the presently understood best mode of these inventions.

DETAILED DESCRIPTION OF THE EMBODIMENTS

In order to make the objectives, technical solutions and advantages of the present disclosure clearer, the present disclosure is described in further detail below with reference to the accompanying drawings and embodiments. It should be understood that specific embodiments described herein are intended only to interpret the present disclosure and not intended to limit the present disclosure.

Unless defined otherwise, all technical and scientific terms used herein have the same meanings as would generally understood by those skilled in the technical field of the present disclosure. The terms used herein in the specification of the present disclosure are for the purpose of describing specific embodiments only, and are not intended to limit the present disclosure. The term "and/or" used herein includes any and all combinations of one or more related listed items.

It should be noted that when one element is referred to as "fixed to" another element, it may be directly disposed on the another element or an intermediate element may exist. When one element is considered to be "coupled to" another element, it may be directly coupled to the another element or an intermediate element may co-exist. The terms "vertical", "horizontal", "upper", "lower", "left", "right" and similar expressions used herein are for illustrative purposes only. When an element or layer is referred to as being "on", "adjacent to", "coupled to", or "coupled to" another element or layer, the element or layer may be directly on, adjacent to, coupled to, or coupled to the another element or layer, or an intervening element or layer may be disposed therebetween. On the contrary, when an element is referred to as being "directly on", "directly adjacent to", "directly coupled to", or "directly coupled to" another element or layer, no intervening element or layer may be disposed therebetween. It should be understood that although terms such as first, second, and third may be used to describe various elements, components, regions, layers, and/or portions, the elements, components, regions, lavers, and/or portions may not be limited to such terms, Such terms are used only to distinguish one element, component, region, layer, or portion from another element, component, region, layer, or portion. Thus, without departing from the teaching of the present disclosure, a first element, component, region, layer, or portion may be referred to as a second element, component, region, layer, or portion.

The terms "include" and/or "comprise" used in the specification specify the presence of the features, integers, steps, operations, elements, and/or components, but may not exclude the presence or addition of one or more of other features, integers, steps, operations, components, and/or their combinations. The singular forms "a/an", "one", and "the" are also intended to include plural forms, unless otherwise clearly specified by the context.

In the continuous development of thermopile infrared sensor arrays, signal processing of thermopile sensors may inevitably encounter the following problems.

Signal processing of a signal readout integrated circuit (RDIC) of a mainstream thermopile array is performed by a pre-amplifier and a high-precision ADC. Both the pre-amplifier and the ADC require a large area and power consumption to ensure performance. For a small-scale array (such as 2*2 or 4*4), sensor pixel cells are large, signals are strong, and a signal processing chip has enough space to place the pre-amplifier and the ADC with high performance. However, as the scale of the array increases (>16*16), dimensions of the pixel cells decrease significantly, and the space of the signal processing chip is insufficient to place more signal processing channels. In addition, more signal processing channels may lead to greater power consumption. In addition to its own current loss, more importantly, a large current may lead to self-heating of the chip. The self-heating may seriously affect calibration of the sensor, thereby significantly reducing temperature resolution and reliability of the thermopile sensors. A pre-amplifier with very high gain, such as more than 10000 times, is generally used in the signal ROIL) of the thermopile array. A low-pass filter is generally required behind the pre amplifier to eliminate high-frequency noise, and then a high-performance ADC is used to convert an amplified signal into a digital signal for output. In order to ensure the performance, a large area and power consumption are required.

Figure 1:
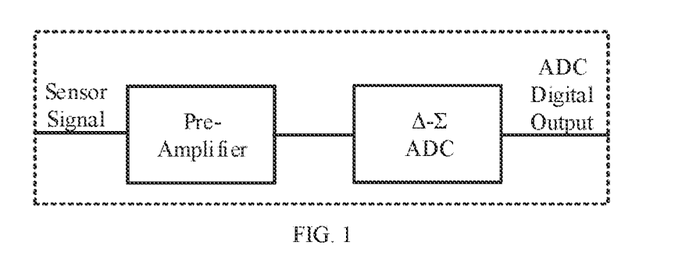
FIG. 1 is a schematic structural diagram illustrating a signal processing channel according to an embodiment.

The present application provides a thermopile array, which is specifically a thermopile infrared sensor array and includes a plurality of sensor pixel cells and an ROIC. The ROIC includes multiple signal processing channels. FIG. 1 is a schematic structural diagram illustrating a signal processing channel according to an embodiment. Each signal processing channel includes a pre-amplifier and an ADC. The pre-amplifier is configured to amplify a sensor signal. In the embodiment shown in FIG. 1, the pre-amplifier is a single-stage amplifier. An input terminal of the ADC is coupled to an output terminal of the pre-amplifier. In the embodiment shown in FIG. 1, the ADC is a delta-sigma ADC. Each signal processing channel is configured to process sensor signals output by i sensor pixel cells (that is, sensor pixels), where i is a positive integer, and when the number of the sensor pixel cells of the thermopile array is no less than 256, i is no greater than the number of the sensor pixel cells of the thermopile array divided by 4 after extraction of root. It may be understood that the above embodiments are mainly aimed at large-scale arrays. The larger the scale of the array, the greater i. When the number of the sensor pixel cells of the thermopile array is less than 256, that is, in the case of a small-scale array, each signal processing channel can be configured to process sensor signals output by the plurality of sensor pixel cells.

In the thermopile array, a sufficient number of parallel signal processing channels are arranged according to the number of the sensor pixel cells, the data processing time of a single signal processing channel is significantly improved, and the pre-amplifier and the ADC with low frequencies can meet the requirements, which effectively reduces noise bandwidth of signal channels, thereby effectively improving a signal-to-noise ratio (SNR) of the signal processing channel, effectively improving system performance, and significantly improving thermal temperature resolution. Meanwhile, because the frequency is reduced, the areas and power consumption of the pre-amplifier and the analog-to-digital converter can be significantly reduced. As the signal processing channels increase, due to the use of a sufficient number of signal processing channels, the integral processing time of the signal processing channels for the sensor signal output by each sensor pixel cell increases greatly, and the noise bandwidth thereof decreases greatly. The pre-amplifier mainly serves to suppress noise and to initially amplify the signal and provide certain driving capability, and requirements for the accuracy of amplification are reduced. Therefore, in order to control an area of the ROTC, the pre-amplifier may be of a low closed-loop gain structure (such as a single-stage amplifier), which can greatly reduce the power consumption and the area, thereby reducing design difficulty of related analog circuits (such as the pre-amplifier and the ADC). An operating current of the signal processing channel can be greatly reduced, so as to effectively overcome the problem of self-heating caused by the large current and greatly reduce the requirement for system temperature calibration. In view of a low closed-loop gain coefficient of the pre-amplifier, the ADC adopts a delta-sigma architecture. Due to the low-pass characteristics of a delta-sigma signal transmission function, no low-pass filter is required between the pre-amplifier and the ADC.

Generally, in order to suppress low-frequency noise, a reference voltage source may be implemented using a special low-noise device or by increasing a device area, which is very expensive.

Figure 2:
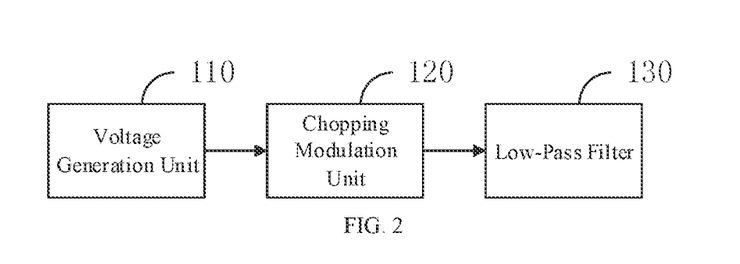
FIG. 2 is a block diagram illustrating a reference voltage generation circuit according to an embodiment.

To this end, the present disclosure provides an ADC that can be applied to the thermopile array in the above embodiment. The ADC includes a reference voltage generation circuit. FIG. 2 is a block diagram illustrating a reference voltage generation circuit according to an embodiment. The reference voltage generation circuit includes a voltage generation unit 110, a chopping modulation unit 120, and a low-pass filter 130. Since sensor signals output by thermopile sensor pixel cells are extremely weak (at a nV level), extremely high requirements are put forward for noise floor of the ADC, and noise characteristics of a reference source are very important for the performance of high-precision ADCs. In order to meet the requirements of applications of the thermopile array, a low-noise voltage source, such as a low-noise bandgap voltage reference (BGR), is used as the voltage generation unit 110. The chopping modulation unit 120 is configured to perform chopping modulation on a voltage signal generated by the voltage generation unit 110, modulate low-frequency noise (e.g., 1/f noise) of the voltage signal into high-frequency noise, and then send the high-frequency noise to the low-pass filter 130. The high-frequency noise is eliminated by the low-pass filter 130 to obtain a reference voltage. The chopping modulation unit 120 may be of a conventional chopping modulation structure in the art, and is not repeated herein.

In the ADC, the low-frequency noise of the voltage signal generated by the voltage generation unit 110 is modulated into the high-frequency noise by the chopping modulation unit 120, and then filtered out by the low-pass filter 130, to serve as the reference voltage. A low-noise reference voltage can be obtained with a simple structure and low costs.

In an embodiment, a cut-off frequency of the low-pass filter 130 is no higher than 100 Hz.

The sensor signals output by the thermopile sensor pixel cells are extremely weak, and the signals are still small after being amplified by the pre-amplifier. Therefore, the ADC may use a lower operating voltage to achieve low power consumption. In an embodiment, the ADC includes a low dropout regulator (LDO). An operating power supply voltage of the ADC is supplied by the LDO. The operating power supply voltage is adjustable in a range from 0.9 V to 1.8 V In an embodiment, the operating power supply voltage of the ADC is less than 1.2 V The ADC includes a bipolar junction transistor (BJT), and Vbe of the BJT serves as the voltage signal generated by the voltage generation unit 110. That is, in the reference source, a voltage of the BGR is replaced by a voltage Vbe (about 0.7 V) between a base and an emitter of the BJT, which can effectively reduce the power consumption of the ADC.

Figure 3:
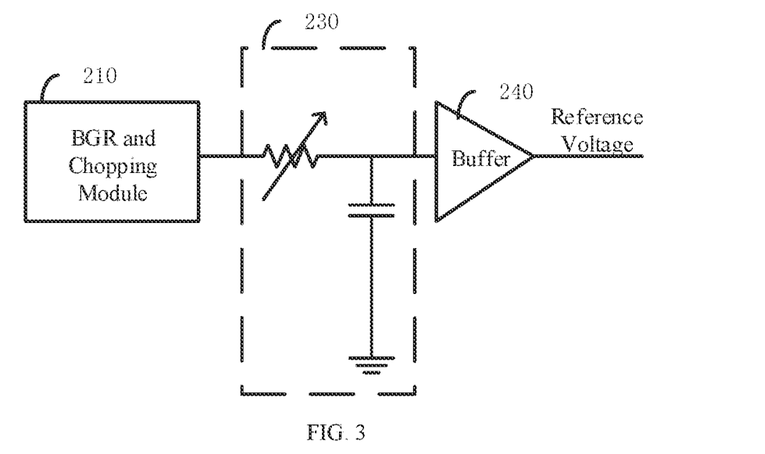
FIG. 3 is a block diagram illustrating a reference voltage generation circuit according to another embodiment.

FIG. 3 is a block diagram illustrating a reference voltage generation circuit according to another embodiment, including a BGR and chopping module 210, a first-order cut-off frequency adjustable low-pass filter 230, and a buffer 240 sequentially coupled. An output terminal of the BGR and chopping module 210 is coupled to an input terminal of the first-order cut-off frequency adjustable low-pass filter 230, and an output terminal of the first-order cut-off frequency adjustable low-pass filter 230 is coupled to an input terminal of the buffer 240. A low-noise BGR modulates low-frequency 1/f noise into high-frequency noise through a conventional chopping modulation structure, eliminates the high-frequency noise through the low-pass filter, and passes through the buffer 240 to serve as the reference voltage. The low-pass filter is a first-order filter with an adjustable cut-off frequency no higher than 100 Hz. In an embodiment, the voltage generated by the low-noise BGR is about 1.2 V.

Figure 4:
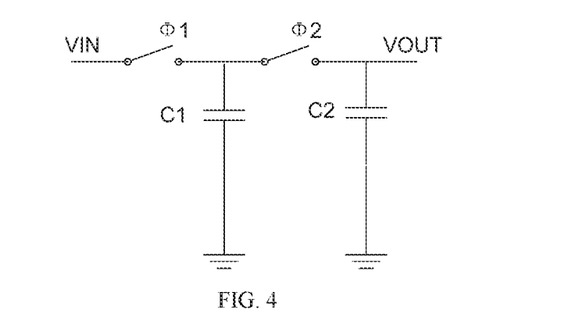
FIG. 4 is a schematic circuit diagram illustrating a low-pass filter according to an embodiment.

The cut-off frequency of the first-order cut-off frequency adjustable low-pass filter 230 shown in FIG. 3 is $1/(2\pi*RC)$. In order to acquire a sufficiently low cut-off frequency, large resistors and capacitors are required to be integrated. In order to reduce an occupied area of a resistor or capacitor, in an embodiment of the present disclosure, a variable resistor in the first-order cut-off frequency adjustable low-pass filter may be replaced with a switch capacitor circuit. As shown in FIG. 4, the low-pass filter includes a resistor unit and a filter capacitor C2. The resistor unit includes a switch capacitor circuit. The switch capacitor circuit includes a capacitor C1, a switch Φ1, and a switch Φ2. On/Off states of the switch Φ1 and the switch Φ2 are mutually staggered. That is, the switch Φ2 is switched off when the switch Φ1 is switched on, and the switch is switched on when the switch Φ1 is switched off. Equivalent resistance of the switch capacitor circuit is R=1/FC (where F denotes a clock frequency, and C denotes capacitance of C1). The occupied area of the resistor or capacitor can be effectively reduced by replacing the variable resistor with the switch capacitor circuit. Meanwhile, the cut-off frequency of the low-pass filter can be precisely controlled by adjusting clock frequencies of the switch Φ1 and the switch Φ2.

When thermopile pixels are low, an example signal conditioning circuit can time-divisionally switch multi-channel signals to single or few signal processing channels by a multiplexer (MUX), at the cost of sacrificing the processing time of a single pixel cell. In other words, noise bandwidth of a single pixel is increased, resulting in poor performance when the pixel array is large. Thermopile infrared sensor arrays initially available on the market have only one or a few pixels (e.g., 8×8 or 16×16 pixels). Each pixel is fairly large (for example, 150~300 μm×150~300 μm). Therefore, a sensor chip has enough space to accommodate a small number of amplifiers or low-pass filters on chips next to the thermopile sensor array. A thermopile sensor array with a larger number of pixels requires a pixel dimension down to a side length of 100 μm or even 25 μm. However, pixel units generate signals proportional to their surface areas. This means that, if the pixel dimension is halved, signal strength further processed is required to be reduced by a quarter. In principle, a dimension of a thermopile unit (thermopile pixel) may be reduced, and more and more pixels are integrated on the sensor chip. For example, 16×16, 32×32, 64×64, 128×128 or higher thermopile pixels are achieved on the sensor chip. A signal voltage of each thermopile pixel is required to be multiplexed using M*N addressing and a MUX switch, that is, to be routed to a common serial signal line, or to reach each row or column via a common serial interface. As the integration increases, a pixel pitch of an array sensor may decrease significantly, output impedance of the sensor may increase significantly, signal strength decreases significantly, and the device and circuit noise may significantly reduce the SNR of the system. Compared with an early single-point thermopile sensor, in the array sensor, the number of signals to be processed increases with an increase in the scale of the array at a same frame rate, which greatly increases requirements for performance, such as bandwidth and gain, of a signal processing circuit.

Figure 5:
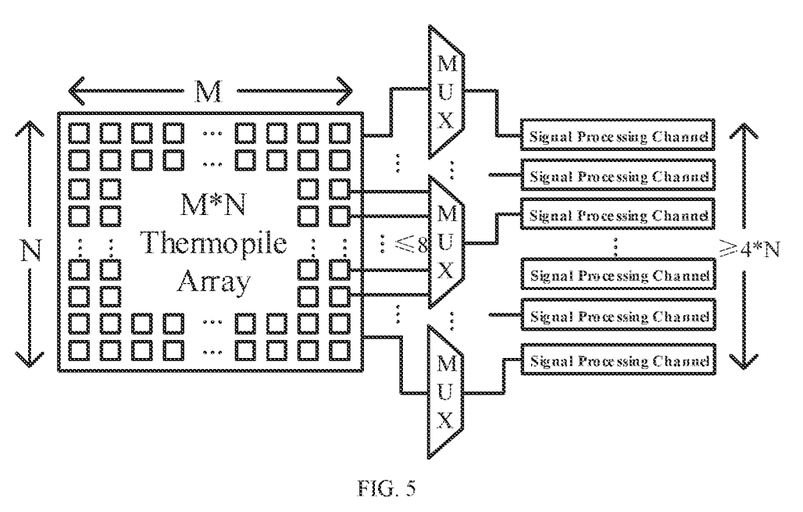
FIG. 5 is a schematic diagram illustrating couplings between signal processing channels and sensor pixel cells according to an embodiment.

FIG. 5 is a schematic diagram illustrating couplings between signal processing channels and sensor pixel cells according to an embodiment. In the embodiment, the sensor pixel cells are arranged to form an M×N array. In order to ensure thermal-temperature resolution and a conversion rate of the thermopile array, at most 8 sensor pixel cells are coupled to one signal processing channel through one MUX, and each sensor pixel cell is only coupled to one signal processing channel. The number of signal processing channels is at least 4 times the number of rows.

In another embodiment, no MUX is provided, the signal processing channels and the sensor pixel cells are identical in number, and the signal processing channels are in one-to-one correspondence to the sensor pixel cells. That is, each signal processing channel performs signal conditioning on the sensor signal of one sensor pixel cell. If no MUX is provided, a chip area occupied by the MUX can be saved, and the design can be simplified.

Due to the use of a large number of signal processing channels, the data processing time of a single signal processing channel is significantly improved. For an example 32*32 thermopile array, the array maintains a conversion rate of 15 frames, and the single signal processing channel switches an input signal through a MUX. Conversion rates of the pre-amplifier and the ADC are required to be higher than 15*32*32=15 kHz. If the solution in the embodiment of the present disclosure that each sensor pixel cell corresponds to a separate signal processing channel is adopted, the conversion rates of the pre-amplifier and the ADC are only required to be 15 Hz to meet the system requirements. Since the conversion time is longer, the noise bandwidth of the signal processing channel decreases significantly (from 15 kHz to 15 Hz), thereby effectively increasing the SNR of the signal processing channel. Meanwhile, the areas and power consumption of the pre-amplifier and the ADC can be significantly reduced due to the reduced frequency.

The performance of the pre-amplifier and the ADC is required to be extremely high when a conventional thermopile signal ROIC has fewer channels. Whether correlated double sampling (CDS) or a chopping modulation technology is used, the design difficulty may be significantly increased, and the system requirements cannot be met due to factors such as areas and power consumption. The use of a sufficient number of parallel signal processing channels in the present disclosure effectively reduces noise bandwidth of the signal channel, thereby effectively improving system performance and significantly improving thermal temperature resolution. Besides, the use of a sufficient number of parallel channels reduces the design difficulty of relevant analog circuits. In addition, power consumption and areas are greatly reduced, which is conducive to integration of the large-scale array (>16*16).

In an embodiment, the thermopile array includes at least one MUX, each MLA has an input terminal coupled to one or more sensor pixel cells and an output terminal coupled to one signal processing channel, and different MUXs are coupled to different signal processing channels. The sensor pixel cells coupled to a single multiplexer are simultaneously switched on or simultaneously switched off, so that the sensor signals of the sensor pixel cells switched on are combined together and sent to the coupled signal processing channel, so as to enhance signal strength.

Figure 6:
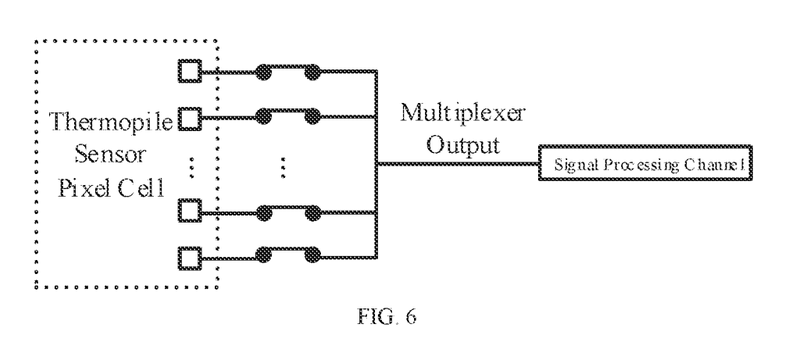
FIG. 6 is a schematic diagram illustrating an embodiment in which a plurality of sensor pixel cells is simultaneously switched on and communicated to a same signal processing channel.

FIG. 6 is a schematic diagram illustrating an embodiment in which a plurality of sensor pixel cells is simultaneously switched on and communicated to a same signal processing channel. The switches of the MUX are turned on or off at the same time, so as to allow sensor signals of multiple/multichannel sensor pixel cells to be combined together and sent to a signal processing channel. The SNR can be improved by combining thermopiles in series and parallel. In the embodiment shown in FIG. 6, each MUX has no requirement for the number of coupled sensor pixel cells. The number may be determined according to an actual system requirement.

An example thermopile uses an integral or slope ADC for data conversion. The configuration is relatively simple, but accuracy is closely related to design and a technological level, the occupied area is large, the speed is very slow, and it is difficult to ensure the system requirement. In view of a low closed-loop gain coefficient of the pre-amplifier in the embodiment of the present disclosure, in an embodiment, an NYQUIST ADC, such as an integral/slope ADC, is not used behind the pre-amplifier, and only a high-precision delta-sigma architecture is used for analog-to-digital conversion. Due to the low-pass characteristics of a delta-sigma signal transmission function, no low-pass filter is required between the pre-amplifier and the ADC.

Figure 7:
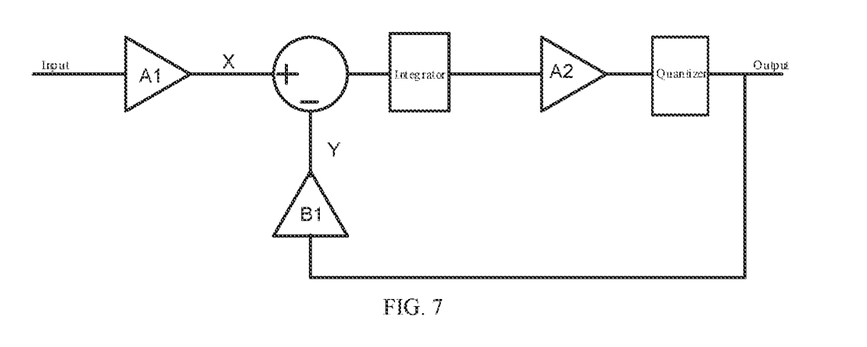
FIG. 7 is a block diagram illustrating a first-order feedback delta-sigma modulator.

The dynamic input range of the conventional ADC is generally large, while the sensor signals output by the thermopile sensor pixel cells are extremely weak, which are far less than a dynamic input range of the ADC even after being amplified by the pre-amplifier, so there is room for optimization of power consumption and performance of the ADC. For small-amplitude input signals, reduction of the dynamic input range of the ADC can effectively improve a signal-to-quantization noise ratio (SQNR). FIG. 7 is a block diagram illustrating a first-order feedback delta-sigma modulator. An input signal passes through a feedforward stage A1 to obtain a signal X, and a signal obtained by subtracting the signal X from a feedback signal Y enters an integrator, enters a quantizer after being processed by A2, and then is output. Moreover, the output signal is further provided for a feedback stage B1, and passes through the feedback stage B1 to obtain the feedback signal Y. In FIG. 7, the integrator may be a low-order integrator, and the quantizer may be a single-bit quantizer. A dynamic output range of the quantizer of the delta-sigma modulator is determined by a voltage difference between a positive reference voltage VREF+ and a negative reference voltage VREF−, while the dynamic input range of the modulator is related to a dynamic range of the quantizer and also to a feedforward coefficient A1 and a feedback coefficient B1. The voltage difference between the positive reference voltage VREF+ and the negative reference voltage VREF− of an example ADC is constant. The dynamic input range of the ADC is adjusted by adjusting a ratio of A1 to B1. The greater the value of B1 divided by A1, the greater the dynamic input range.

Figure 8:
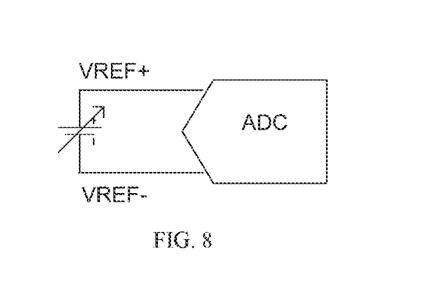
FIG. 8 is a schematic diagram illustrating how a dynamic input range of an ADC can be adjusted by adjusting positive and negative reference voltages of the ADC.

The sensor signals output by the thermopile sensor pixel cells are extremely weak and are still small even if amplified by the pre-amplifier. In view of this, effective temperature resolution of the system can be improved by reducing the dynamic input range of the ADC (in a case where a thermopile weak signal is no less than amplitude of an output signal of the pre-amplifier, the smaller the dynamic range of signal input of the ADC, the higher the temperature resolution of the system). Based on the above, an example manner is to acquire a smaller dynamic input range by reducing the feedback coefficient B1. However, for a switch capacitor ADC, a smaller feedback coefficient B1 corresponds to a requirement for a larger capacitor area. In order not to increase the capacitor area, in an embodiment of the present disclosure, a small voltage difference is adopted between the positive reference voltage VREF+ and the negative reference voltage VREF− of the ADC to reduce the dynamic input range of the ADC, referring to FIG. 8. In an embodiment, the voltage difference between the positive reference voltage and the negative reference voltage is adjustable in a range from ±50 mV to ±200 mV, so as to adjust the dynamic input range of the ADC. In an embodiment, an adjustment range step is ±50 mV.

The manner of reducing the voltage difference between the positive reference voltage and the negative reference voltage is particularly suitable for low-voltage applications, which can effectively reduce system power consumption and reduce design difficulty. In an embodiment, the ADC further includes an operational amplifier configured to amplify the positive reference voltage. Reference noise (for example, reference noise of the BGR) is also amplified while the voltage is amplified, which are in a proportional relation. Therefore, better noise characteristics can also be acquired based on a lower positive reference voltage, thereby improving performance of the ADC.

It may be understood that, in addition to the adjustment on the voltage difference between the positive reference voltage and the negative reference voltage, the feedforward coefficient A1 of the ADC can be appropriately increased or the feedback coefficient B1 can be reduced, so as to conveniently adjust the dynamic input range of the ADC and effectively improve the temperature resolution of the system.

In view of the use of a large number of parallel signal channels, a frequency range of a single signal processing channel is greatly reduced, thereby reducing the noise bandwidth requirements of the pre-amplifier and the ADC. According to the foregoing, the dynamic input range of the ADC is dynamically adjusted to improve the thermal temperature resolution of the system by adjusting the voltage difference between the positive reference voltage and the negative reference voltage and adjusting the feedforward coefficient A1/feedback coefficient B1. The adjustable range is large. In an embodiment, in order to ensure the stability of the system in the case of a large change in the dynamic input range, the ADC is implemented using a first-order single-bit quantizer feedback structure, which can also save the area and power consumption of the ADC. The use of the feedback structure can simplify circuit design and facilitate integration of large-scale signal channels. A conditioning circuit as a comparative example completes the analog-to-digital conversion by using a delta-sigma architecture of two or more orders. The structure is relatively complex and is not conducive to large-scale integration of a thermopile array ROIC. The simplified first-order delta-sigma ADC can significantly reduce the area and power consumption, facilitating the integration of large-scale signal channels. In an embodiment, an over-sampling rate of the ADC is greater than 4096. At the over-sampling rate, the performance of the ADC depends on in-band low-frequency noise floor (independent of the SQNR). An SNR of MOD1 is infinitely close to that of a high-order modulator, but an area and power consumption of MOD1 are obviously better than those of the high-order modulator.

At the over-sampling rate of OSR>4096, the influence of thermal noise of a sampling capacitor decreases significantly according to the following formula:

$$E^2{}_T=(1/OSR) \times kT/C$$

where $E^2{}_T$ denotes thermal noise energy of the sampling capacitor in unit of $V^2$, OSR denotes the over-sampling rate, k denotes a boltzmann constant, T denotes a Kelvin temperature, and C denotes capacitance. In an embodiment, in order to reduce power consumption and area costs, a unit capacitor no greater than 100 fF is used in the ADC.

In an embodiment, due to the use of an ADC with a high over-sampling rate, the requirement for an integrator inside the ADC is greatly reduced. In order to save the power consumption and the area, an operational transconductance amplifier (OTA)-type integrator as a comparative example may be replaced with an inverter-type integrator. In an embodiment, the inverter-type integrator is suitable for low-voltage (<1.5 V) applications. The replacement of the conventional OTA-type integrator with the inverter-type integrator can effectively reduce the area and the power consumption, particularly suitable for low-voltage applications.

In an example solution, for weak analog signals, in order to reduce quantization noise of the ADC, a high-performance ADC may improve performance with a method of adding a dithering signal. A dithering clock is generally implemented using a pseudo-random algorithm. The method may undoubtedly increase circuit complexity, and the introduction of dithering can cause a problem of system stability for the ADC. To this end, in an embodiment of the present disclosure, the ADC further includes a dithering signal generation unit configured to generate a dithering signal at a preset frequency and output the dithering signal to an input terminal of the ADC. The preset frequency is adjustable. After the preset frequency is set, the generated dithering signal has a fixed clock cycle prior to next adjustment. For a low-order delta-sigma ADC with a small and adjustable voltage difference between the positive reference voltage and a negative reference voltage, the solution that the dithering signal has an adjustable clock cycle may affect stability of a loop the least.

In the description of the specification, reference terms such as "some embodiments", "other embodiments", and "ideal examples" mean that a particular feature, structure, material, or feature described in connection with the embodiment or example is included in at least one embodiment or example of the present disclosure. In the specification, the schematic expressions to the above terms are not necessarily referring to the same embodiment or example.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present disclosure, and their description is specific and detailed, but cannot therefore be understood as a limitation on the patent scope of the present disclosure. It should be noted that those of ordinary skill in the art may further make variations and improvements without departing from the conception of the present disclosure, and these all fall within the protection scope of the present disclosure. Therefore, the patent protection scope of the present disclosure should be subject to the appended claims.

What is claimed is:

1. A thermopile array, comprising:
   a plurality of sensor pixel cells; and
   a readout integrated circuit (ROIC) including multiple signal processing channels, each of the signal processing channels including:
   a pre-amplifier configured to amplify a sensor signal, the pre-amplifier being a single-stage amplifier; and
   an analog-to-digital converter (ADC) having an input terminal coupled to an output terminal of the pre-amplifier, the ADC being a delta-sigma ADC and including a reference voltage generation circuit;
   wherein the reference voltage generation circuit includes:
   a voltage generation unit;
   a chopping modulation unit configured to perform chopping modulation on a voltage signal generated by the voltage generation unit, and modulate low-frequency noise of the voltage signal into high-frequency noise; and
   a low-pass filter configured to eliminate the high-frequency noise to obtain a reference voltage; and
   wherein each of the signal processing channels is configured to process the sensor signals output by i sensor pixel cells, where i is a positive integer, and when the number of the plurality of sensor pixel cells is no less than 256, i is no greater than the number of the sensor pixel cells of the thermopile array divided by 4 after extraction of root; and wherein no low-pass filter is arranged between the ADC and the pre-amplifier of each of the signal processing channels.

2. The thermopile array according to claim 1, wherein the multiple signal processing channels and the plurality of sensor pixel cells are identical in number, and the signal processing channels are in one-to-one correspondence to the sensor pixel cells; or the thermopile array further includes at least one multiplexer (MUX), each MUX has an input terminal coupled to one or more of the sensor pixel cells and an output terminal coupled to one of the signal processing channels, and different MUXs are coupled to different signal processing channels; and wherein the sensor pixel cells coupled to a single MUX are simultaneously switched on or simultaneously switched off, so that the sensor signals of the sensor pixel cells switched on are combined together and sent to the coupled signal processing channel.

3. The thermopile array according to claim 1, wherein the pre-amplifier adopts a chopper-stabilized modulation mode.

4. The thermopile array according to claim 1, wherein at most 8 sensor pixel cells are coupled to one signal processing channel through one MUX.

5. The thermopile array according to claim 1, wherein the sensor pixel cells are arranged to form a sensor array, and the number of the signal processing channels is at least 4 times the number of rows of the sensor array.

6. The ADC according to claim 1, wherein the voltage generation unit is a bandgap voltage reference (BGR); or
an operating power supply voltage of the ADC is less than 1.2 V, the ADC includes a bipolar junction transistor (BJT), and Vbe of the BJT serves as the voltage signal generated by the voltage generation unit.

7. The ADC according to claim 1, wherein a cut-off frequency of the low-pass filter is no higher than 100 Hz.

8. The ADC according to claim 1, wherein the low-pass filter includes a resistor unit and a filter capacitor, and the resistor unit includes a switch capacitor circuit.

9. The ADC according to claim 1, wherein the reference voltage generated by the reference voltage generation circuit includes a positive reference voltage and a negative reference voltage, and a voltage difference between the positive reference voltage and the negative reference voltage is adjustable in a range from ±50 mV to ±200 mV, so as to adjust a dynamic input range of the ADC.

10. The ADC according to claim 1, further comprising a dithering signal generation unit configured to generate a dithering signal at a preset frequency and output the dithering signal to an input terminal of the ADC.

11. The ADC according to claim 1, wherein the ADC is of a first-order single-bit quantizer feedback structure.

12. The ADC according to claim 11, wherein an oversampling rate of the ADC is greater than 4096, and an integrator in the ADC is an inverter-type integrator.

13. The ADC according to claim 1, wherein the ADC includes a capacitor having a unit capacitance of not greater than 100 fF.

* * * * *